United States Patent [19]

Hayes

[11] Patent Number: 4,735,913

[45] Date of Patent: Apr. 5, 1988

[54] SELF-ALIGNED FABRICATION PROCESS FOR GAAS MESFET DEVICES

[75] Inventor: John R. Hayes, Summit, N.J.

[73] Assignee: Bell Communications Research, Inc., Livingston, N.J.

[21] Appl. No.: 860,139

[22] Filed: May 6, 1986

[51] Int. Cl.$^4$ .................... H01L 21/265; H01L 21/44
[52] U.S. Cl. .................... 437/39; 357/22 I; 357/22 J; 148/DIG. 10; 148/DIG. 140; 148/DIG. 142; 437/184; 437/41; 437/177; 437/192; 437/931; 437/912
[58] Field of Search ................. 357/22 I, 22 J; 29/571, 29/576 B, 591; 148/DIG. 140, DIG. 142, DIG. 105; 437/39, 41, 184, 177, 192, 931, 912

[56] References Cited

U.S. PATENT DOCUMENTS

| | | | |
|---|---|---|---|
| 3,994,758 | 11/1976 | Ogawa | 29/591 |
| 4,062,103 | 12/1977 | Yamagishi | 29/591 |
| 4,301,233 | 11/1981 | Calviello | 148/DIG. 100 |
| 4,404,732 | 9/1983 | Andrade | 29/571 |
| 4,546,540 | 10/1985 | Ueyanagi et al. | 357/22 J |
| 4,581,076 | 4/1986 | Badawi | 148/1.5 |
| 4,601,095 | 7/1986 | Kikuchi et al. | 357/22 I |
| 4,641,161 | 2/1987 | Kim et al. | 357/23.2 |

FOREIGN PATENT DOCUMENTS

0156185 10/1985 European Pat. Off. .
2005074 4/1979 United Kingdom .

OTHER PUBLICATIONS

Marinace, "Diffusion of Zinc Through Films of Refractory Metals on GaAs", J. of Electrochem. Soc., vol. 117, No. 1, pp. 145-146, Jan. 1970.
Kuriyama, "Profile of Controlled Etching for Mo/W-siol Double Layers", Japanese J. of App. Physics, vol. 25, No. 2, Feb., 1986, pp. L96-L98.
Takahashi, "Submicrometer Gate Fabrication of GaAs MESFET by Plasma Etching", IEEE Trans. on Electron Devices, vol. ED 25, No. 10, Oct. 78, pp. 1213-1218.
Morkoc, "Tungsten/Gold Gate GaAs Microwave FET," Electron Letters, vol. 14, pp. 514-515, Aug. 1978.
Matsumura, "Submicrometer Lift Off Line with T-Shaped Cross Sectional Form, Electronics Letters, Apr. 81, pp. 450-451.
"Self-Aligned Pt-Buried Gate FET Process with Surface Planarization Technique for GaAs LSI", *IEEE GaAs IC Symposium IEEE Press*, T. Terada et al., New York (1983).
"Self-Aligned Submicron Gate Digital Integrated Circuits", *IEEE Elec. Div. Letters*, DOL-4, H. M. Levy, R. E. Lee, pp. 102-104, 1983.
"Fabrication and Performance of Submicron Gallium Arsenide MESFET Digital Circuits by Self-Aligned Ion Implantation", R. A. Sadler, PH.D Thesis, Cornell University, Jan., 1984, pp. 100-105.

*Primary Examiner*—Brian E. Hearn
*Assistant Examiner*—M. Wilczewski
*Attorney, Agent, or Firm*—James W. Falk; Daniel R. McGlynn

[57] ABSTRACT

A self-aligned process for fabricating a GaAs semiconductor MESFET by depositing a layer of tungsten over the GaAs substrate, and ion implanting the substrate to provide channel doping. A gate composed of a conductive refractory material is deposited and delineated on the tungsten layer, and source and drain regions are formed in the substrate using the gate as a mask. The resulting device is annealed and contacts are formed to the source and drain regions, and to the gate.

5 Claims, 2 Drawing Sheets

SELF-ALIGNED FABRICATION PROCESS FOR GAAS MESFET DEVICES

BACKGROUND OF THE INVENTION

1. Field of the Invention

This invention relates to semiconductor device fabrication, and in particular a method of forming a GaAs semiconductor MESFET device using a self-aligned gate process and a lift-off technique.

2. Description of the Prior Art

There has been a variety of self-aligned gate processes that have been utilized in gallium arsenide (GaAs) integrated circuit fabrication. One of the more important techniques is the so-called T-gate process for ion implantation, described in "Self-Aligned Submicron Gate Digital Integrated Circuits", H. M. Levy and R. E. Lee, IEEE Elec. Div. Letters, EDL-4 pp. 102–104, 1983 and "Fabrication and Performance of Submicron Gallium Arsenide MESFET Digital Circuits by Self Aligned Ion-Implantation", R. A. Sadler, Ph.D. thesis, Cornell University, January, 1984.

The T-gate structure itself consists of two metal layers. The top metal layer is defined by a lift-off process and serves as a mask for both plasma etching and ion implantation. It is first used to reactive-ion etch the underlying refractory gate metal, with an intentional undercut on each side to form the T-gate structure. This structure then masks the device channel for a self-aligned n+ implant, so that the lateral gap between gate edge and n+ regions can be made quite shallow with high surface doping without increasing the gate capacitance. The high doping at the surface reduces the ohmic contact resistance, and the shallow n+ regions minimize short-channel effects.

The principal disadvantage of the existing T-gate process is two-fold. First, the number of process steps required to complete the fabrication can dramatically decrease yield. Second, the gate Schottky barrier height, which plays a critical role on device performance, can vary with surface condition. In a conventional T-gate process the channel is annealed before deposition of the gate material and cannot be cleaned by etching without considerably complicating the processing sequence. As a result, existing T-gate processes are impractical for high volume production processes of GaAs integrated circuits.

There are other self-aligned gate processes for GaAs, such as described in the paper, "Self-Aligned Pt-Buried Gate FET Process with Surface Planarization Techniques for GaAs LSI" by T. Terada et al, IEEE GaAs IC Symposium IEEE Press, New York (1983), but such techniques do not significantly decrease the fabrication complexity or yield a uniform Schottky barrier gate height across the wafer.

Another method is disclosed in U.S. Pat. No. 4,404,732, issued Sept. 20, 1983 to Andrade, which describes a fabrication process of a gallium arsenide MESFET device which provides for the in situ growth of self-aligned, raised source and drain regions. One feature is placing a high temperature resistant gate structure, such as tungsten, on the gallium arsenide substrate. Then by a process, including molecular beam epitaxy, growing epitaxial gallium arsenide on each respective side of the gate so as to form a raised source region and a raised drain region. The MESFET channel region, which is defined by the proximate edges of the source and the drain, is self-aligned with the edges of the gate by virtue of the in situ process for the formation of the source and drain.

Prior to the present invention, there has not been a process which provides a self-aligned GaAs device with a limited number of simple processing steps.

SUMMARY OF THE INVENTION

Briefly, and in general terms, the present invention provides a method of fabricating a semiconductor device by providing a GaAs semiconductor body having a major surface; depositing a layer of a tungsten on the major surface of the semiconductor body; implanting the substrate to form a channel region and forming and delineating a gate of a conductive refractory material, forming source and drain regions using the gate as a mask; annealing the device; and forming electrical contacts to the source and drain regions, and the gate.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawing.

DESCRIPTION OF THE PREFERRED EMBODIMENTS

The present invention provides a new method of fabricating a self-aligned gate field effect transistor (SAGFET) in a semiconductor body. Although the sequence of steps for making a SAGFET in GaAs is described below, it is by no means restricted to this semiconductor compound. The process according to the present invention is also applicable to any semiconductor compound that forms a Schottky barrier at the desired temperature of operation.

Figure 1:
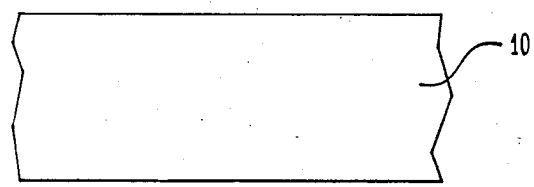
FIG. 1 illustrates a cross-sectional view of a portion of a GaAs semiconductor wafer which forms the substrate in the first step according to the present invention.
Figure 2:
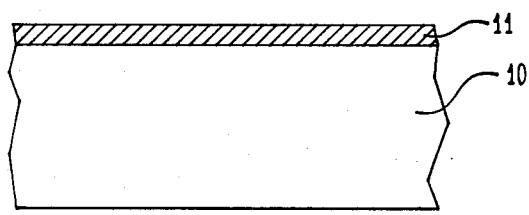
FIG. 2 illustrates a cross-sectional view of the deposition of a tungsten layer on a major surface of the gallium arsenide substrate.

In the preferred embodiment of the present invention, the process begins with an integrated circuit quality GaAs substrate 10, shown in cross-sectional view in FIG. 1. An integrated circuitry quality wafer is one having an electron mobility >5000 cm$^2$/V$_s$ at room temperature, a resistivity >2×10$^8$ ohms-cm and an etch pit density less than 1×10$^5$ cm$^{-2}$. As shown in FIG. 2, a thin layer 11 (approximately 1000A) of a refractory metal or silicide is then deposited on a major surface of the substrate 10. In a preferred embodiment, tungsten is sputter deposited on the wafer in an Argon atmosphere, with the initial vacuum, prior to the introduction of Argon of less then 5×10$^{-7}$ Torr.

Figure 3:
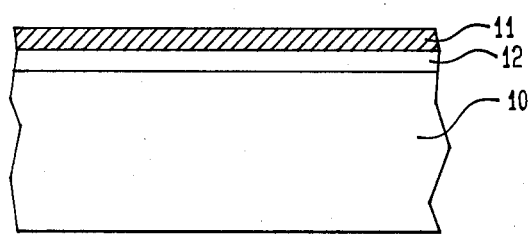
FIG. 3 illustrates a cross-sectional view of the deposition of a channel implant in the gallium arsenide substrate according to the process of the present invention.

Following the deposition of a tungsten layer 11, a suitable dopant, such as Si$^{28}$ or Si$^{29}$, is ion implanted into the substrate through the tungsten layer, as shown in FIG. 3, to form the FET channel. A typical energy for the implant of the channel layer through a thin tungsten layer 11 (approximately 600A) is 140 KeV at a dose of about 10$^{13}$ cm$^{-2}$.

Figure 4:
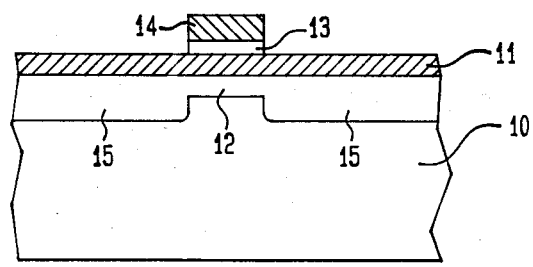
FIG. 4 illustrates a cross-sectional view of the deposition of a metallic gate on the substrate followed by source and drain implants using the gate as a mask in a self-aligned fabrication process according to the present invention.

FIG. 4 illustrates the deposition of a metallic gate followed by source and drain implants using the gate as a mask in a self-aligned process according to the present invention. A metallic gate is formed from conductive refractory layers 13 and 14 (which in the preferred embodiment is a multilayer combination of Pt-Au). The gate platinum-gold multilayer 13, 14 is deposited using, for example, an electron beam evaporator having a vacuum prior to deposition of less than 5×10$^{-7}$ Torr. Following deposition of the layers 13 and 14 over the surface, they are patterned according to techniques known in the art. An example of such a technique is depositing a masking layer thereover, patterning the masking layer, and then forming the desired gate pattern. The gate 13, 14 forms an implant gate etch mask for the subsequent ion implantation of the source and drain region.

After the implants in the source and drain regions 15, (as well as in the channel region 12) have been made, according to techniques known in the art, implant damage is annealed out of the wafer. The implanted impurity atom (Si$^{28}$ or Si$^{29}$) becomes electrically active by donating an electron into the conduction band. According to the present invention, the process of annealing the wafer is typically performed at a temperature of 825° C. for 30 minutes, with the tungsten serving as an anneal mask. Another typical anneal temperature and timer is 950° C. for 2 seconds. In addition to the preferred embodiment described above, one may also utilize other refracting metals and silicides, and other top gate metal apart from Pt-Au i.e., multilayer combination of Cr-Au, or Ti-Au, which are within the ambit of the present invention.

Figure 5:
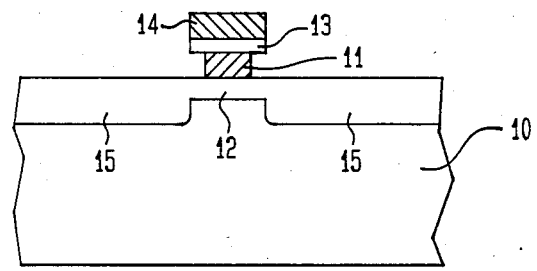
FIG. 5 illustrates a cross-sectional view of the undercutting of the tungsten gate layer on the substrate and activation of the implant by annealing according to the process of the present invention.

FIG. 5 shows the subsequent undercutting of the tungsten gate layer. The tungsten layer is etched in a CF$_4$ plasma in a planar reactive ion etcher to expose the source and drain regions 15 and to undercut the gate 13, 14. The Pt-Au gate 13, 14 is unaffected by the CF$_4$ plasma and serves as an etch mask, as shown in FIG. 5.

Figure 6:
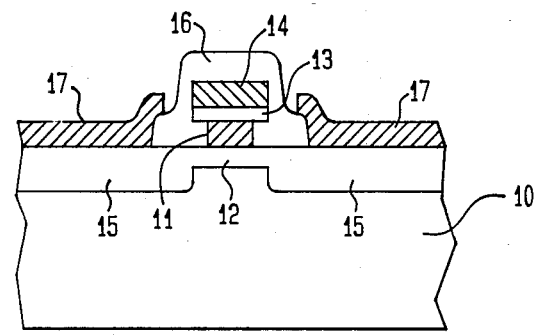
FIG. 6 illustrates a cross-sectional view of the deposition of a nitride passifying layer over the surface of the substrate in FIG. 5, followed by patterning a passifying layer so as to create apertures for source and drain contacts, and the deposition of ohmic source and drain contacts.

FIG. 6 shows the deposition of a nitride passifying layer over the surface of the structure in FIG. 5, patterning such layer so as to create apertures for source and drain contacts, and the deposition of ohmic source and drain contacts.

Immediately following the plasma etch, a passivating dielectric layer 16 (Si$_3$N$_4$) is deposited in a plasma deposition station by the reaction of NH$_4$ and SiH$_4$ at temperatures around 300° C. (SiO$_2$ can also be used) on the sample protecting the exposed areas around the gate. Apertures are then opened in the Si$_3$N$_4$ layer by etching the layer with an oxygen plasma in a planar reactive ion etcher in order that ohmic contacts to the source and drain regions 15 may be made. The ohmic contacts preferably consist of an Au-Sn or Au-Ge based alloy 17 which are deposited in the apertures in the Si$_3$N$_4$ layer 16. The ohmic contacts are made ohmic by thermally annealing the device at elevated temperatures (about 400° C.) for short periods of time (about 30 seconds). After a quick alloy, the final device is formed, as shown in FIG. 6.

It should be noted that additional process steps could be employed in order to isolate the device from surrounding active semiconductor regions e.g., utilizing a patterned boron ion implant prior to the removal of the tungsten, as is known to those skilled in the art.

It will be obvious to those skilled in the art that the semiconductor process according to the present invention can be implemented with various semiconductor technologies and different combinations of known process steps, and that the preferred embodiments illustrated here are merely exemplary. The thickness of the layers, depth of penetration of the various zones and regions, the interlayer materials, and in particular the configuration and distance between the various layers and zones, as well as the types of solid state devices to be formed can be chosen depending upon the desired applications and properties. These and other variations can be further elaborated by those skilled in the art without departing from the scope of the present invention.

The present invention is also not restricted to the specific semiconductor materials and circuits described. For example, it may be pointed out that semiconductor materials other than GaAs or even III A-V B compounds, may be used. Furthermore, the conductivity types and dopant levels of various layers and the polarity of the operating voltages may be adapted to the specific device and application. Moreover, the voltage level and the static or dynamic nature of the signals applied to the various terminals and electrodes of the device, as well as the voltage sources, may be suitably selected as desired for a particular application.

Without further analysis, the foregoing will so fully reveal the gist of the present invention that others can, readily adapt it for various applications without omitting features that fairly constitute essential characteristics of the generic or specific aspects of this invention, and, therefore, such adaptations should and are intended to be comprehended within the meaning and range of equivalence of the following claims.

What is claimed is:

1. A self-aligned process for fabricating a semiconductor MESFET device comprising the steps of:

providing a semiconductor substrate;
depositing a layer of tungsten over said substrate;
ion implanting said substrate with a dopant species through said layer of tungsten to provide channel doping;
depositing a platinum-gold layer;
depositing a masking layer over said platinum-gold layer;
patterning said platinum-gold layer defined by said masking layer to form a gate etch mask;
forming source and drain regions in said substrate using said gate etch mask as a mask;
annealing said device;
selectively removing portions of said tungsten layer to form a gate using said gate etch mask region as a mask; and forming electrical contacts to said source region, to said drain region, and to said gate.

2. A process as defined in claim 1, wherein said step of depositing a layer of tungsten is performed by sputter deposition.

3. A process as defined in claim 1, wherein said step of selectively removing portions of said layer of tungsten is performed by plasma etching.

4. A process as defined in claim 1, wherein said step of annealing consists of heating said substrate at 825° C. for approximately 30 minutes using said tungsten layer as an anneal mask.

5. A process as defined in claim 1 wherein said substrate is composed of gallium arsenide.

* * * * *